(12) United States Patent
Sourour et al.

(10) Patent No.: US 6,909,884 B2
(45) Date of Patent: Jun. 21, 2005

(54) AMPLIFIER PHASE CHANGE COMPENSATION

(75) Inventors: Essam Sourour, San Diego, CA (US); Wail Refai, Cary, NC (US)

(73) Assignee: Telefonaktiebolaget LM Ericsson (publ) (SE)

( * ) Notice: Subject to any disclaimer, the term of this patent is extended or adjusted under 35 U.S.C. 154(b) by 558 days.

(21) Appl. No.: 09/770,035

(22) Filed: Jan. 25, 2001

(65) Prior Publication Data

US 2002/0098812 A1 Jul. 25, 2002

(51) Int. Cl.[7] .............................. H03C 1/52; H04B 1/02
(52) U.S. Cl. ...................... 455/108; 455/91; 455/112; 455/114.3
(58) Field of Search .......................... 455/91, 108, 109, 455/112, 114.3, 115.1, 115.4; 330/149

(56) References Cited

U.S. PATENT DOCUMENTS

| | | | |
|---|---|---|---|
| 4,701,717 A | | 10/1987 | Radermacher et al. |
| 5,150,072 A | * | 9/1992 | Malec .................... 330/149 |
| 5,748,678 A | * | 5/1998 | Valentine et al. ........... 375/297 |
| 5,898,906 A | * | 4/1999 | Williams .................... 455/75 |
| 5,901,346 A | * | 5/1999 | Stengel et al. ............. 455/126 |
| 6,147,553 A | | 11/2000 | Kolanek |
| 6,266,517 B1 | * | 7/2001 | Fitzpatrick et al. ........ 455/114.3 |
| 6,567,653 B1 | * | 5/2003 | Sanders .................... 455/126 |
| 6,614,854 B1 | * | 9/2003 | Chow et al. ................ 375/297 |
| 6,650,875 B1 | * | 11/2003 | Rozenblit et al. ............. 455/91 |

FOREIGN PATENT DOCUMENTS

| | | |
|---|---|---|
| EP | 0964511 A1 | 12/1999 |
| EP | 0982849 A1 | 3/2000 |
| EP | 1032120 A2 | 8/2000 |

* cited by examiner

Primary Examiner—Temica M. Beamer
(74) Attorney, Agent, or Firm—Coats & Bennett, P.L.L.C.

(57) ABSTRACT

A baseband signal phase-compensation technique offsets undesirable phase shifts, or changes in phase shift, introduced in a transmit signal when changing transmit amplifier operating modes. Such mode changes may, for example, entail switching amplifier stages in and out of an amplification signal path. A phase compensator selectively operates on the baseband signal or signals to subtract out an amount of phase shift equal to the amount of phase shift added by switching one or more additional amplifier stages into the amplification signal path. Compensating baseband signals is this manner may be particularly valuable for the reverse link signal of a mobile terminal operating in a wireless communication environment such as CDMA2000. In such environments, abrupt phase shift changes in the transmit signal associated with transmit signal power control are undesirable.

25 Claims, 8 Drawing Sheets

AMPLIFIER PHASE CHANGE COMPENSATION

BACKGROUND OF THE INVENTION

The present invention relates generally to wireless communication systems, and particularly to RF signal transmission in such systems.

Wireless communication systems, such as cellular telephone networks, are typically based on one or more standardized communication schemes. Examples of air interface standards include a variety of schemes used with varying degrees of prevalence around the world. The Telecommunication Industry Association (TIA) and the Electronic Industry Association (EIA) publish as standard known as TIA/EIA-136, which is a commonly used North American standard. The TIA/EIA-136 standard provides digital communication and data services based on Time Division Multiple Access (TDMA) techniques at both 800 MHz and 1900 MHz. The Global System for Mobile Communications (GSM) standard is roughly equivalent and finds broad usage in Europe. Other widely used standards include IS-95 and IS-2000, which represent Code Division Multiple Access (CDMA) standards providing data and communication services at 800 MHz and 1900 MHz.

IS-2000 is a developing standard, coming under the umbrella of the so-called third generation (3G) of wireless communication systems. The wideband CDMA (WCDMA) 3G standard represents a rough European equivalent of the IS-2000 initiative. While IS-2000 has similarities with the earlier IS-95 CDMA standard, IS-2000 extends the bandwidth utilization of IS-95, providing system operators with additional service capability. In improving bandwidth utilization and extending other service features of IS-95, the IS-2000 standard changes certain signaling requirements between mobile terminals and base stations.

All of these standards, to varying degrees, have different signaling requirements. However, to provide users with maximum versatility, wireless communication devices commonly provide compatibility with multiple communication standards. While this is a matter of practicality from the consumer's perspective, it imposes certain system design challenges. For example, economic and physical limitations dictate that all or most of the same transmit and receive hardware within a mobile device be used for all of the air interface standards supported by that device.

BRIEF SUMMARY OF THE INVENTION

The present invention includes a system and method to prevent undesirable phase shift changes in a transmit signal caused by changing amplifier configurations. Switching additional amplifier stages into an amplification signal path exemplifies such a change. When an additional amplifier stage is switched into the amplification signal path, it adds a known amount of phase shift to the transmit signal. A phase compensator operates on the baseband signal, or signals, associated with the transmit signal to subtract out an amount of phase shift equal to that added by the additional amplifier stage. When the additional amplifier stage is switched out of the amplification signal path, the added phase shift is no longer applied to the baseband signal or signals.

In a mobile terminal, transmit signal power control is commonly required. For example, under IS-95 and IS-2000 (CDMA2000) standards, the mobile terminal must control its reverse link signal power over a relatively large dynamic range. Multistage amplifier arrangements, with selectively switched amplifier stages, may be used to effect transmit signal power control over such wide dynamic ranges. In IS-2000, as well as in certain other wireless communication standards, the abrupt transmit signal phase changes associated with switching one or more amplifier stages into and out of the amplification signal path are undesirable. The mobile terminal may include the present invention to prevent undesirable transmit signal phase changes associated with the above transmit signal power control technique. Of course, the invention may apply to other transmitter environments, such as base stations and other communication systems.

DETAILED DESCRIPTION OF THE INVENTION

Figure 1:
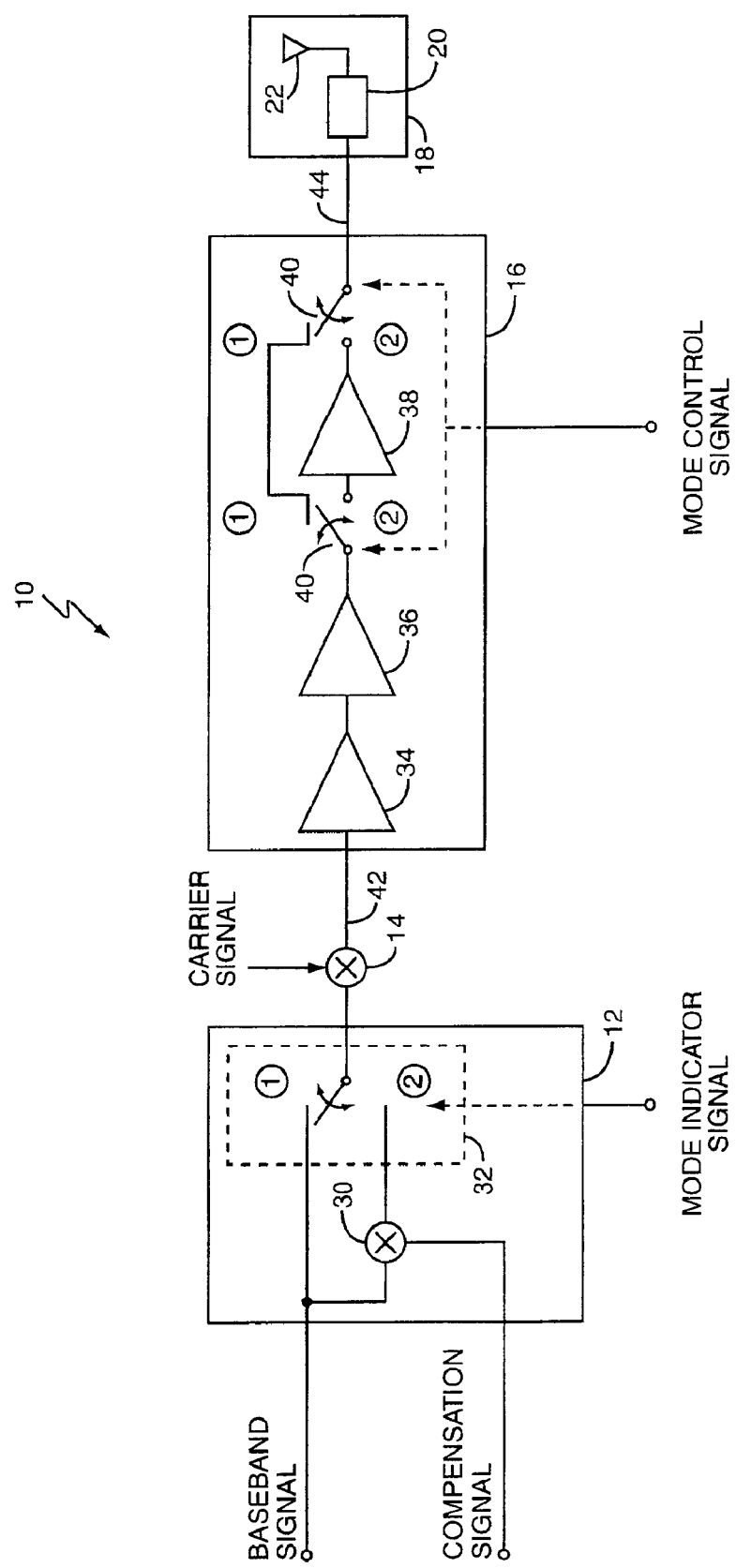
FIG. 1 is a diagram of an exemplary transmitter in accordance with the present invention.

Turning now to the drawings, FIG. 1 is a diagram of an exemplary transmitter in accordance with the present invention. The transmitter is referred to generally by the numeral 10, and includes a phase compensator 12, a modulator 14, and a transmit amplifier 16. The transmit amplifier 16 provides a transmit signal to an antenna assembly 18. The antenna assembly 18 typically comprises a coupling circuit 20, and an antenna 22. The coupling circuit 20 typically comprises a duplexer and/or a transmit/receive switch (neither shown).

In operation, the modulator 14 modulates a carrier signal responsive to a baseband information signal. The resulting modulated signal drives an amplifier input 42, and is amplified by the transmit amplifier 16 to generate the transmit signal, which the transmitter 16 provides to the antenna assembly 18 via transmitter output 44. The amplifier circuitry between the input 42 and output 44 comprises an amplification signal path that typically includes a pre-amplifier 34, and first and second amplifier stages 36 and 38, respectively. Control logic 40 responsive to a mode control signal selectively switches the amplifier stage 38 into and out of the amplification signal path for reasons explained below.

Commonly, the transmitter 10 must generate the transmit signal over a wide dynamic range of RF signal power. Wireless communication standards, such as IS-95 and the newer IS-2000 governing CDMA-based wireless communication networks, typify such power control requirements. The amplifier stage 36 provides transmit signal amplification over a first portion of that signal power range, while the combination of amplifier stages 36 and 38 allow operation over the balance of the range. In general, the transmit amplifier 16 may be implemented with any number of amplifier stages, some or all of which may be selectively enabled as a function of required transmit signal power. For example, assume that the transmit amplifier 16 as shown is extended to include amplifier stages 38A, 38B, and so on. The control logic 40 may be extended to enable selectively switching one or more of these stages into and out of the amplification signal path, depending upon the range of transmit signal power needed.

In operation, the transmit amplifier 16 is selectively operated in one of at least two modes related to the range of transmit signal power needed. The number or differing types of amplifier stages (e.g., 36 and 38) that are switched into the amplification signal path distinguish the different modes. In the illustration, a default or first mode of operation may for example be associated with operating only a single amplifier stage 36. Thus, the control logic 40 in the transmit amplifier 16 is set to switch positions "1," bypassing the second amplifier stage 38. In a second mode, the control logic 40 changes to switch position "2," thereby placing a second amplifier stage 38 into the amplification signal path. Of course, if the transmit amplifier 16 includes a plurality of switched amplifier stages 38, additional modes may be defined by enabling different numbers of those stages via the control logic 40.

Figure 2:
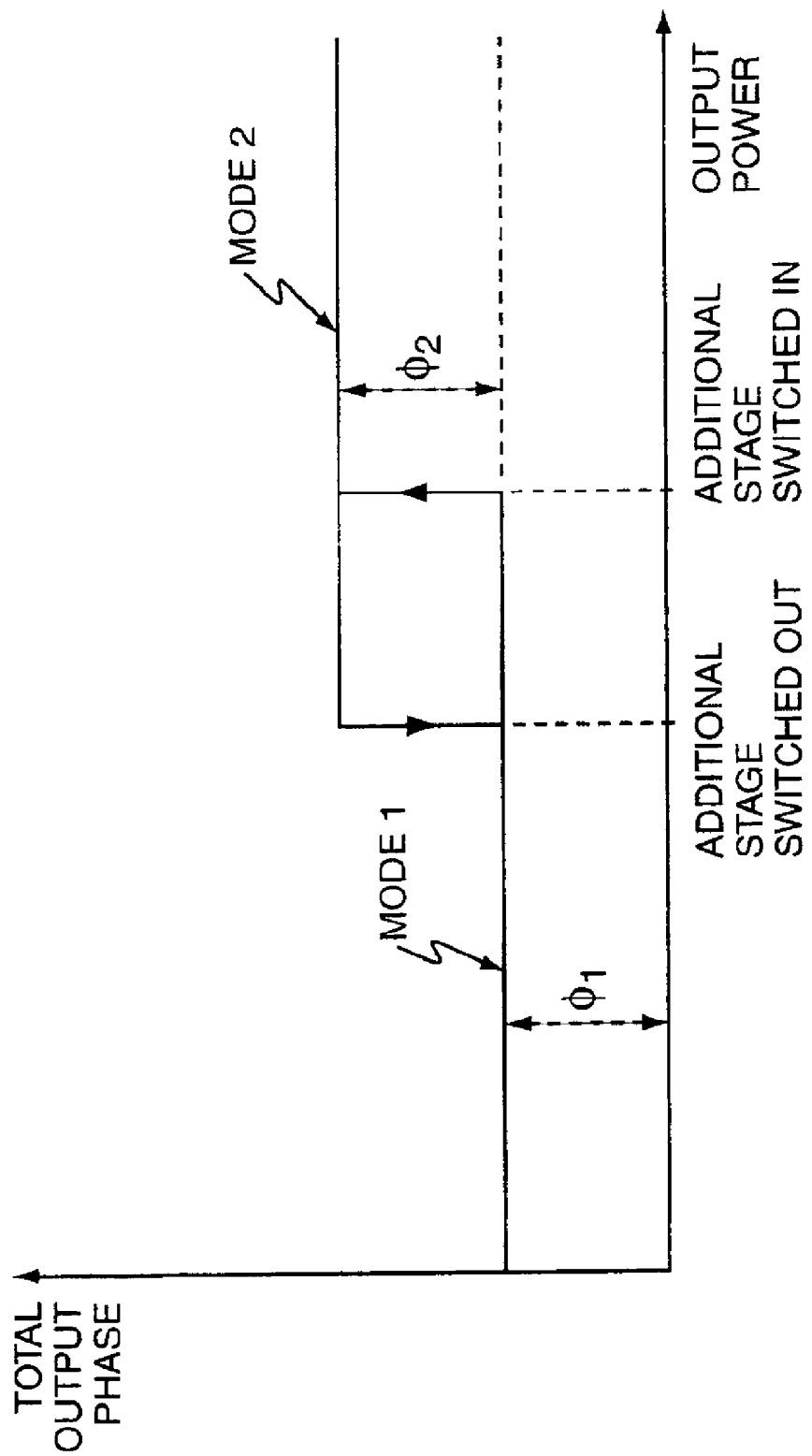
FIG. 2 is a diagram illustrating modal-based changes in transmit signal phase shift associated with the transmitter of FIG. 1.

FIG. 2 illustrates the phase shift imparted by the transmit amplifier 16 in its different modes of operation, relative to the modulated output signal from the modulator 14. That is, the circuitry of the transmit amplifier 16 imparts a known, mode-dependent amount of phase shift when amplifying the modulated output signal. The total phase shift imparted by the transmit amplifier 16 may be taken between its input 42 and its output 44. When operating in a first mode, Mode 1, the transmit amplifier 16 imparts a fixed phase shift to the transmit signal in the amount of $\phi_1$. Once the transmit signal power requirements exceed that practically available with just the first amplifier stage 36, the second stage 38 is switched into the amplification signal path, and the transmit amplifier 16 changes to a second mode, Mode 2. The change from Mode 1 to Mode 2 causes a known, step change in transmit signal phase change from $\phi_1$ to $\phi_2$. When transmit signal power requirements fall below the range defined for Mode 2, the transmit amplifier 16 returns to Mode 1.

In general, modes or configurations in the transmit amplifier 16 are changed based on switching between different amplification signal paths. The different amplification signal paths may be chosen based on needed power, or based on other changes in transmit signal requirements. More generally, different amplification signal paths within the transmit amplifier 16 do not necessarily share individual amplifier stages, such as amplifier stages 36 and 38.

In some communication standards, such as IS-95, the step changes in transmit signal phase associated with changing between the various transmit amplifier modes is not problematic. That is, the changes in phase shift do not cause information decoding errors at a remote receiver, such as a remote base station in a wireless communication network. However, the same changes in transmit signal phase shift may cause errors in received signal decoding within an IS-2000 system, as is explained in more detail later.

Figure 3:
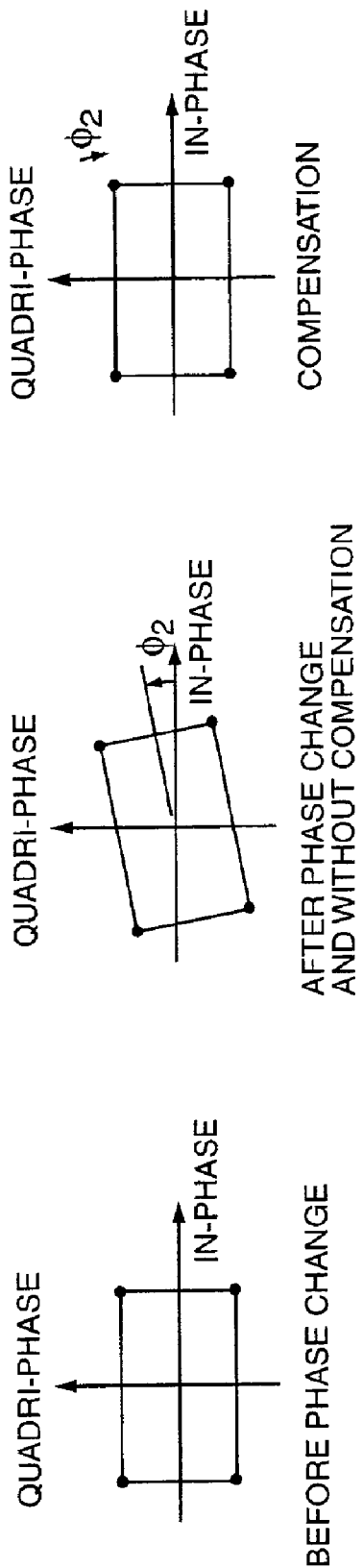
FIG. 3 is a diagram illustrating transmit signal phase shift effects on transmit symbol constellation points.

FIG. 3 illustrates the effect of modal phase shift changes on transmitted signal constellation points. In IS-95, IS-2000, and other communication standards such as TIA/EIA-136, data for transmission is represented as a series of symbols. Each symbol may be transmitted as a unique pairing of amplitude and phase values, with each pairing represented by one constellation point. Four possible constellation points are shown for illustration. In the leftmost diagram, the four possible constellation points are shown normalized with respect to the default or Mode 1 phase shift of the transmit amplifier 16.

When the transmit amplifier 16 changes from Mode 1 to Mode 2 by enabling its second amplifier stage 38 via the control logic 40, the overall phase shift imparted to the transmit signal changes, as discussed above. The middle diagram illustrates the uncompensated effect of the mode change on the constellation points. Undesirably, the mode change causes the constellation points to rotate by an amount corresponding to the additional phase shift associated with switching the second amplifier stage 38 into the amplification signal path.

The phase compensator 12 is used to avoid or prevent the undesirable change in transmit signal phase shift. When the control logic 40 of the transmit amplifier 16 switches in the second amplifier stage 38, the control logic 32 in the phase compensator 12 changes from switch position "1" to position "2." This action couples the phase compensated version of the baseband information signal to the modulator 14, rather than the uncompensated version that is used when the second amplifier stage 38 of the transmit amplifier 16 is inactive. The complex multiplier 30 in the phase compensator 12 receives a compensation signal based on the known change in phase shift caused by switching in the second amplifier stage 38.

The multiplication of the baseband information signal by the compensation signal via the complex multiplier 30 imparts a compensating phase shift to the baseband information signal that offsets or negates the change in phase shift of the transmit amplifier 16. The rightmost diagram illustrates the effect of compensating the baseband information signal. In general terms, the phase compensator 12 "subtracts" an amount of phase shift from the baseband information signal equal to the additional phase shift $\phi_2$ imparted by the second amplifier stage 38. This action of the phase compensator 12 effectively cancels the unwanted change in phase shift associated with changing modes in the transmit amplifier 16.

Of course, operation of the phase compensator 12 may be extended to any number of operating modes of the transmit amplifier 16, each mode being associated with a different change in transmit signal phase shift. Such extension might simply entail changing or updating the compensation signal supplied to the phase compensator 12, as the different modes of the transmit amplifier 16 are activated and de-activated.

Figure 4A:
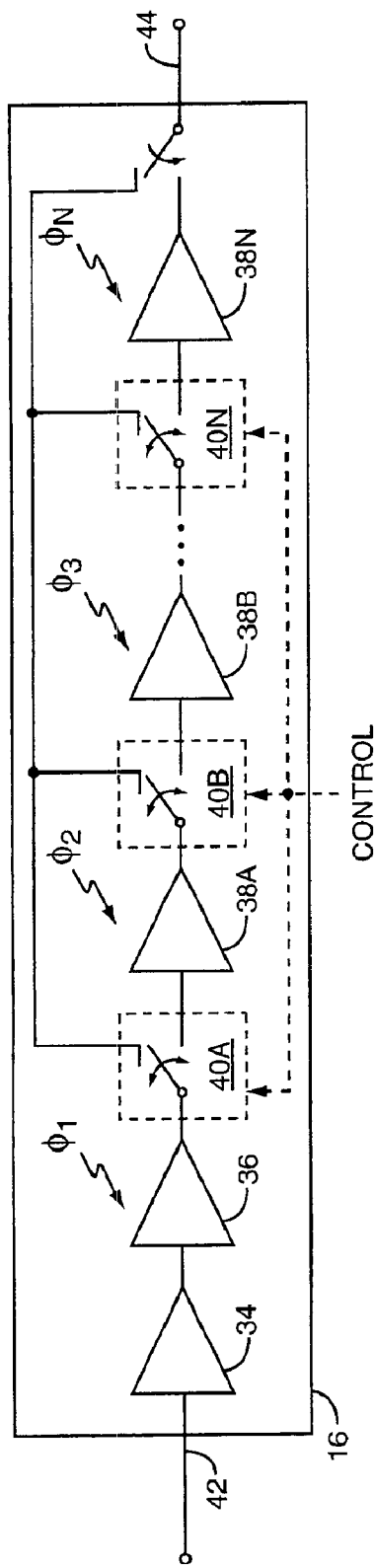
FIGS. 4A and 4B are diagrams of exemplary variations on the transmitter of FIG. 1
Figure 4B:
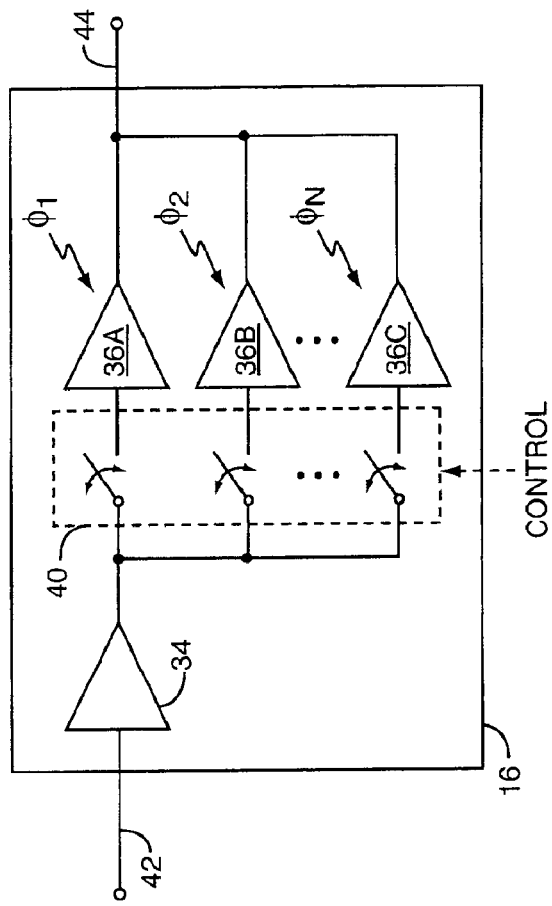

FIGS. 4A and 4B illustrate examples of transmit amplifiers 16, each having multiple amplifier configurations, with each configuration associated with a different transmit signal phase shift. In FIG. 4A, the transmit amplifier 16 includes a plurality of successive amplifier stages 38A . . . 38N. Using the control logic 40A . . . 40N, any combination of these successive stages may be switched into and out of the amplifier signal path. Thus, the transmit amplifier 16 may impart phase shifts of $\phi_1 \ldots \phi_N$, depending upon its current configuration. Accordingly, the compensation signal provided to the phase compensator 12 may be set based on the current configuration of the transmit amplifier 16.

FIG. 4B is a diagram of a parallel configuration for the transmit amplifier 16. The transmit amplifier 16 includes a plurality of parallel amplifier stages 36A . . . 36N. Any number of these stages may be enabled depending, for example, on required transmit signal power. Each parallel stage 36 may impart a different phase shift to the transmit signal. As in other configurations, the value of the compensation signal provided to the phase compensator 12 may be set according to the particular phase shift associated with a current one of the possible configurations for the transmit amplifier 16. In general, the phase compensator 12 may be used to compensate for transmit signal phase shift changes arising from any change in mode or configuration of the transmit amplifier 16.

Figure 5:
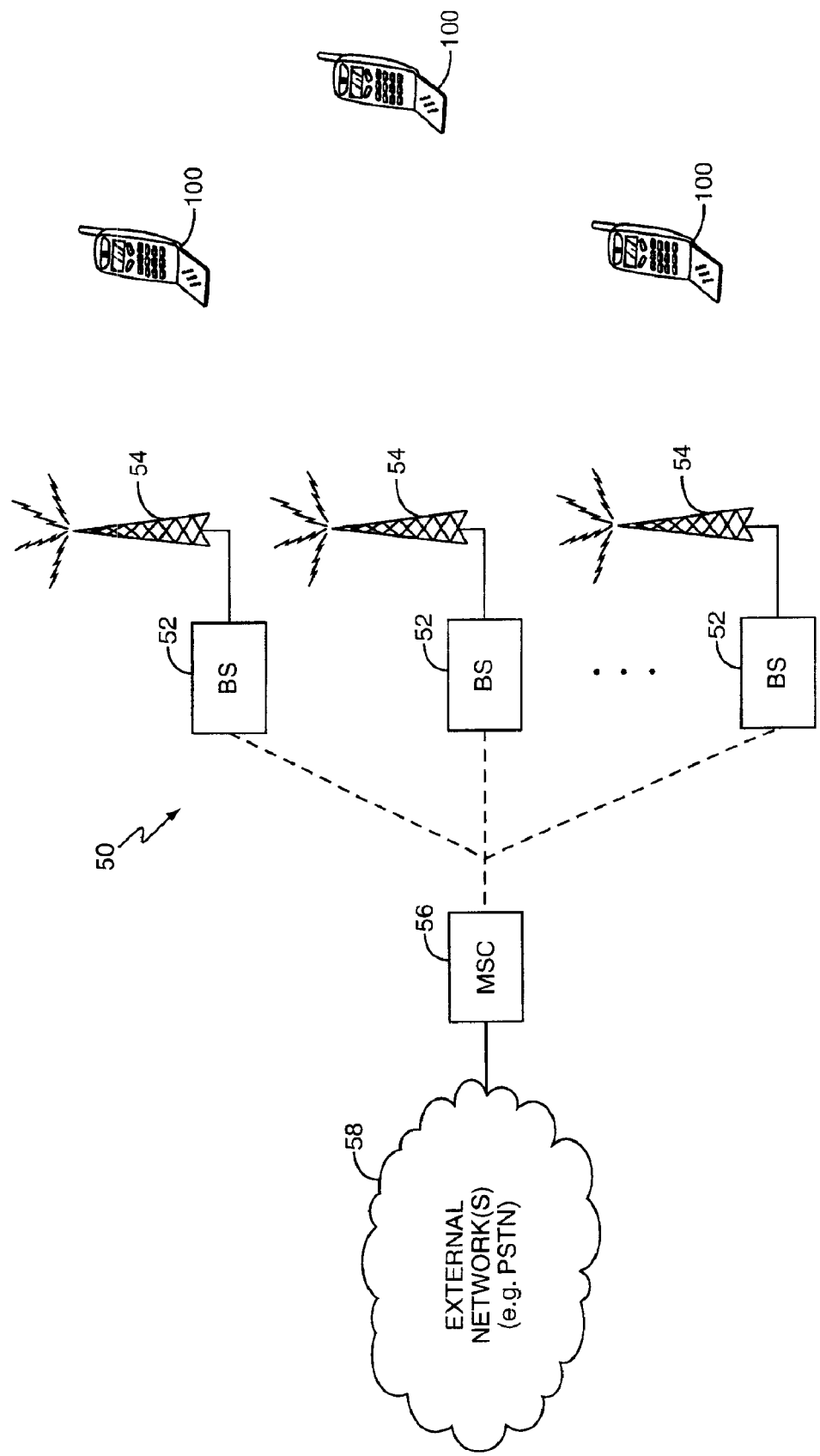
FIG. 5 is a diagram of an exemplary mobile network.

FIG. 5 is a diagram of an exemplary mobile network supporting wireless communications. The mobile network is generally referred to by the numeral 50, and includes one or more base stations 52, each with an associated receive/transmit antenna 54, one or more mobile switching centers (MSCs) 56 interfacing the base stations 52 with one or more external networks 58, and a plurality of mobile terminals 100.

Wireless signaling between the mobile terminals 100 and the base stations 52 support communications between the mobile terminal users and users of the external networks 58, as well as with other mobile terminal users. Each base station supports communication and control traffic for mobile terminals 100 within the coverage area of its associated antenna 54. In turn, the MSC 56 coordinates and controls the functions of each base station 52, as well as interfacing communications traffic between the various base stations 52 and the external networks 58. The external networks 58 may include but are not limited to the Public Switched Telephone Network (PSTN), the Internet, and various Integrated Services Digital Networks (ISDN).

Figure 6:
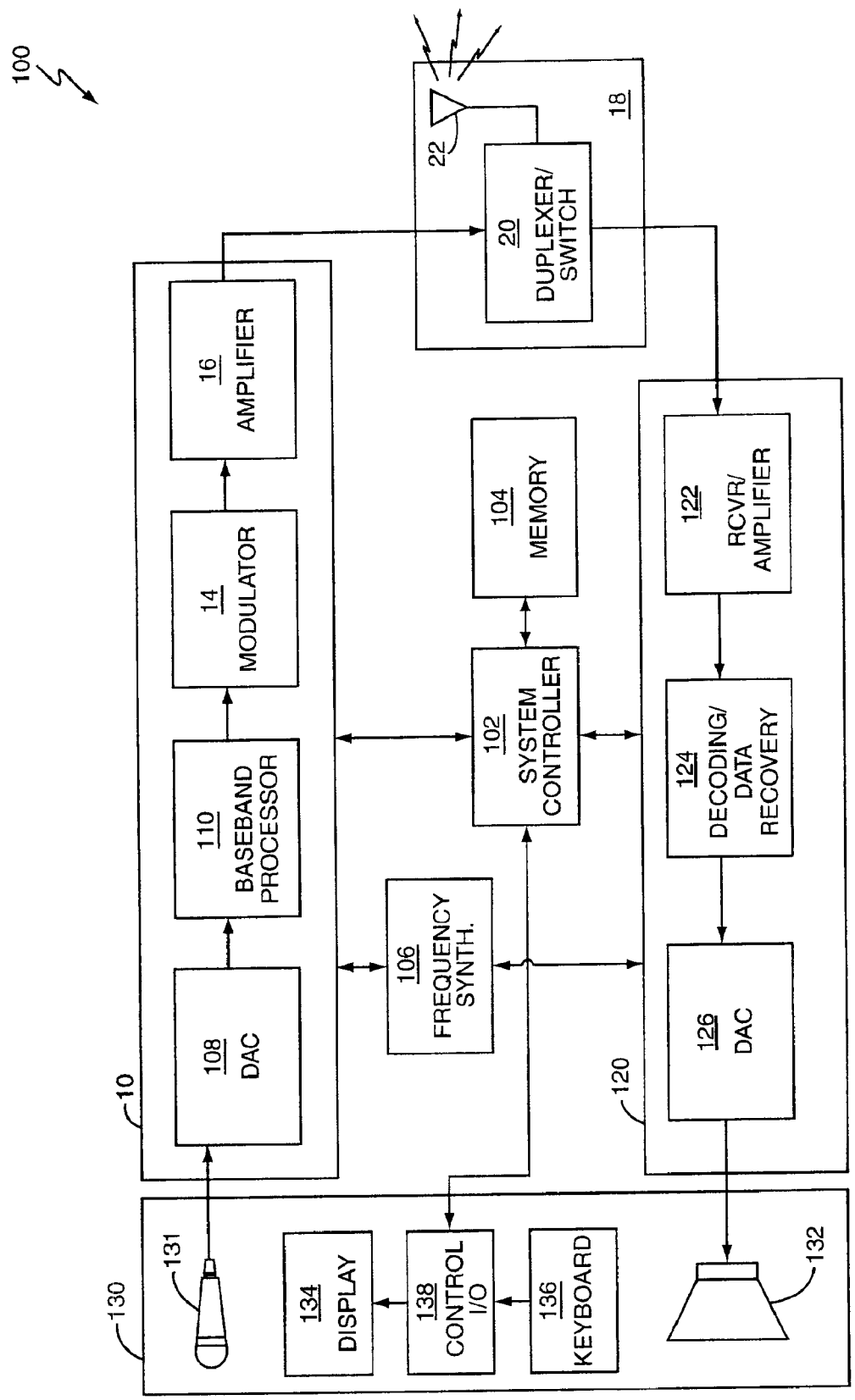
FIG. 6 is a diagram of an exemplary mobile terminal for use in the mobile network of FIG. 5.

FIG. 6 is a diagram of an exemplary mobile terminal 100 for use in the mobile network 50. The mobile terminal 100 includes a transmitter 10 in accordance with the present invention, a receiver 120, a user interface 130, and the antenna assembly 18 introduced earlier.

In operation, the mobile terminal 100 sends and receives information via radio frequency signaling between it and its supporting base station 52. The system controller 102 is typically implemented as one or more microcontrollers (MCUs) that manage the user interface 130, and provide overall control of the mobile terminal 100. The memory 104 generally includes application software, default values for constants used in operation, and working space for data. One or more values used in the generation of the compensation signal provided to the phase compensator 12 may be stored in the memory 104. Such storage may be performed once at the time of manufacture of the mobile terminal 100, or may be done or updated periodically later during the operating life of the mobile terminal 100.

The user interacts with the mobile terminal 100 via the user interface 130. A microphone 131 converts user speech signals into a corresponding analog signal, which is provided to the transmitter 10 for subsequent conversion, processing, and transmission to the base station 52 via the antenna assembly 18. The receiver 120 received signals from the base station 52 and extracts received audio information, e.g., speech from a remote user, and provides a resulting audio signal for driving a speaker 132 included in the user interface 130. The user interface 130 further includes a display 134 for providing visual information to the user, and a keypad 136 for accepting commands and data input from the user. The user interface 130 may include an I/O interface 138 for interfacing the display 134 and keypad 136 to the MCU 102. In short, the user interface 130 allows the user to send and receive speech and other audio information, to dial numbers, and to enter other data as needed.

The receiver 120 includes a receiver/amplifier 122, a decoding/data recovery module 124, and a digital-to-analog converter (DAC) 126. In operation, signals are received via the antenna 22, with the coupling circuit 20 providing signal isolation between received and transmitted signals. In some implementations, the coupling circuit includes a receive/transmit switch to selectively connect either the transmitter 10 or receiver 120 to the antenna 22. In other cases, the coupling circuit 20 includes a diplexer or other filter element to provide signal isolation during simultaneous receive and transmit operations.

Received signals are routed to the receiver amplifier 122, which provides conditioning, filtering, and down conversion of the received signal. In digital implementations, the receiver/amplifier 122 may use analog-to-digital converters (ADCs) to provide the decoding/data recovery module 124 with successive digital values corresponding to the incoming received signal. The decoding/data recovery module 124 recovers the audio information encoded in the received signal, and provides the DAC 126 with digital values corresponding to the received audio information. In turn, the DAC 126 provides an analog output signal suitable for driving the speaker 154.

The transmitter 10 is configured in accordance with the present invention and includes an analog-to-digital converter (ADC) 108, a baseband processor 110, modulator 14, and transmit amplifier 16. In operation, the ADC 108 converts analog speech signals from the microphone 131 to corresponding digital values. The baseband processor 110 processes and encodes these digital values, providing error correction encoding and translation into a format suitable for the modulator 14. As shown later, the baseband processor 110 may incorporate the phase compensator 12.

The modulator 14 generates a modulated output signal by modulating a carrier signal (or signals) using the baseband information signals it receives from the baseband processor 110. Typically, the modulator 14 receives a reference signal at or related to the desired carrier frequency from the frequency synthesizer 106. The modulated output signal from the modulator 14 serves as an input to the transmit amplifier 16. In turn, the transmit amplifier 16 generates the transmit signal for transmission to the base station 52 via the antenna 22 based on amplifying the modulated output signal.

Figure 7:
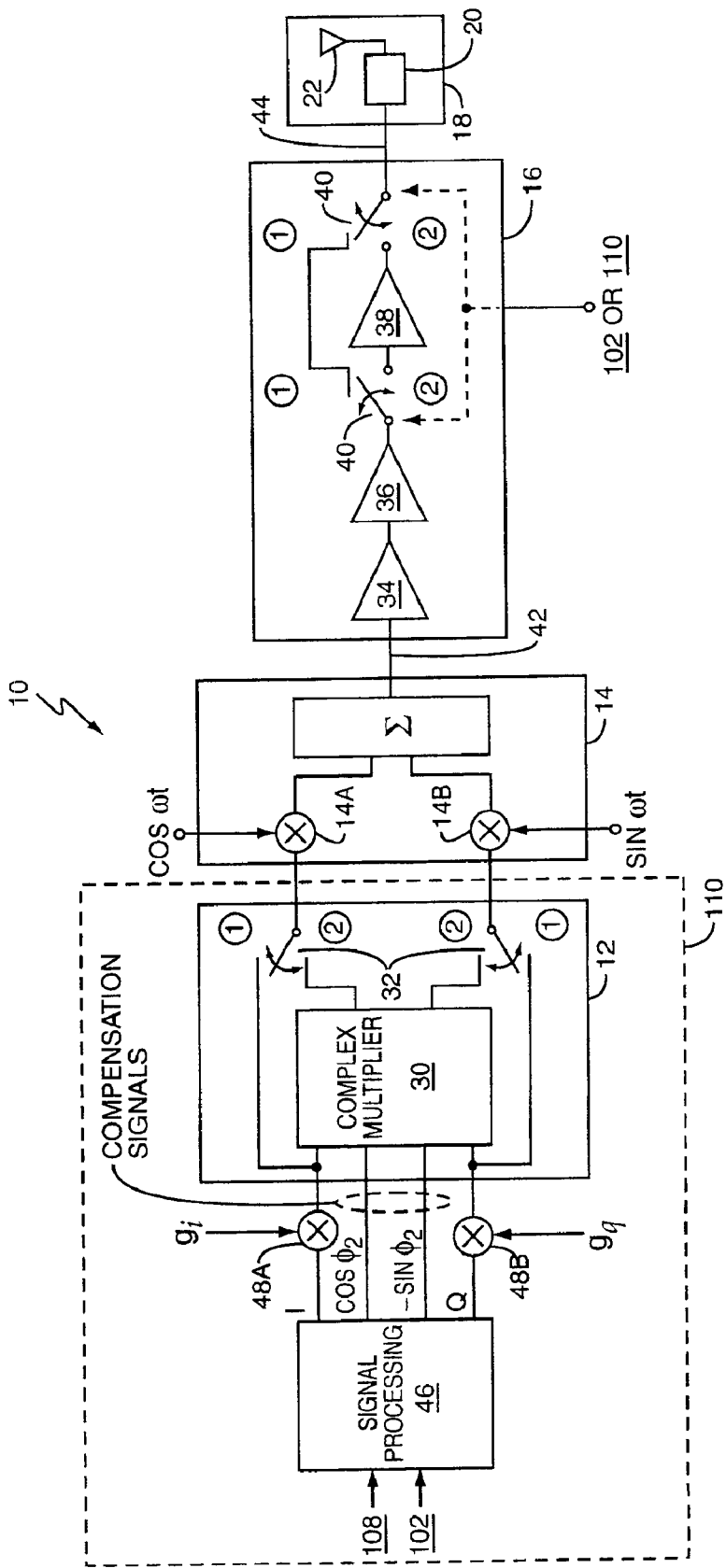
FIG. 7 is a more detailed diagram of the transmitter of FIG. 1 for use in the mobile terminal of FIG. 6.

FIG. 7 provides more details for the transmitter 10 in the context of the mobile terminal 100. A signal processor 46 provides baseband information signals I and Q (in-phase and quadrature) to the phase compensator 12. The phase compensator 12 also receives compensation signals, $\cos \phi_2$ and $\sin \phi_2$, from the signal processor 46. The modulator 14 includes I and Q modulators 14A and 14B. Each modulator 14A and 14B generates a modulated output signal at the desired carrier frequency based on modulating a reference signal, either $\cos \omega t$ or $\sin \omega t$, by the respective baseband information signal. The two modulated output signals are summed together by the summing circuit 15, and then provided to the transmit amplifier 16.

The gain-control multipliers 48A and 48B provide individual gain control for the I and Q baseband information signals. This might be desirable for certain communication standards, such as IS-2000, where the mobile terminal 100 transmits a reverse link pilot channel based on the I baseband information signal, and a reverse link traffic channel based on the Q baseband information signal. The baseband information signals typically comprise data from the ADC 108 and from the system controller 102.

The mode control signal drives to the control logic 40 in the transmit amplifier 16 to switch in amplifier stage 38 in response to a mode control signal. Note that the control logic 40 may include both switch control logic, as well as any actual switches that may be used to configure the amplification signal path of the transmit amplifier 16. Typically, the system controller (MCU) 102 or the baseband processor 110 generates the mode control signal. The same signal, or a separate but synchronized indicator signal, may be used to operate the control logic 32 of the phase compensator 12.

When the amplifier stage 38 is switched in, the control logic 32 connects the outputs of the complex multiplier 30 to the I and Q channel modulators, 14A and 14B, respectively. Thus, when the second amplifier stage, stage 38, is active, the modulator 14 receives the phase-compensated baseband information signals. When the transmit amplifier 16 returns to single stage operation—stage 38 switched out—the control logic 32 assumes switch position "1" and the I and Q baseband information signals pass uncompensated to the modulator 14. Depending upon the specific implementation of the phase compensator 12, the control logic 32 may comprise actual switches, or may comprise a logical function that allows the phase compensation to be selectively applied to the baseband information signals.

In the above example, operation of the complex multiplier 30 is based on a complex multiplication of terms involving the input baseband information signals and the input phase compensation signals. If I and Q are in-phase and quadrature baseband signals, respectively, then operation of the complex multiplier 30 may be expressed as, $(I+jQ)(\cos \phi_2 - j \sin \phi_2)$, where "j" is the imaginary number $\sqrt{-1}$. Multiplication of these terms imparts a phase shift equal to $\phi$ to each of the I and Q signals. Thus, $\phi_2$ may be generally represented as $\phi$, and set based on the current mode of the transmit amplifier 16.

In an exemplary implementation, the signal processor 46, gain-control multipliers 48A and 48B, and the phase compensator 12 form a portion of the baseband processor 110. The baseband processor 110 may comprise a digital signal processor (DSP) that may, or may not, further incorporate receive signal processing capabilities. If the baseband processor 110 incorporates such receive signal processing, it typically includes the functionality of the decoding/data recovery module 124.

As earlier noted, the memory 104 may be used to store reference values for generating the compensation signals used by the phase compensator 12. The memory 104 may actually comprise more than one memory device, possibly of different types. Thus, the memory 104 may include dynamic RAM, static RAM, and non-volatile storage, such as FLASH or EEPROM devices. Depending upon its configuration, the MCU 102 may incorporate some elements of memory 104, and some elements of memory 104 may be directly accessible to the baseband processor 110. Even if not directly accessible, the reference value or values stored in the memory 104 related to generation of the compensation signals may be provided to the baseband processor 110 by the MCU 102.

The reference information may include look-up table data, or coefficients such as might be used in polynomial curve fitting, to describe how the characteristic phase shift or change in phase shift of the transmit amplifier 16 changes over time and/or temperature. Thus, the phase shift value used to generate the compensation signals may be updated as a function of, for example, ambient temperature of the mobile terminal 100 or transmit amplifier 16, or as a function of aging. The mobile terminal 100 can incorporate an inexpensive temperature-sensing element, such as a bandgap reference device, which detects temperature using a simple semiconductor junction. The ADC 108 may be used to digitize analog temperature signals from such a device, or the MCU 102 might incorporate ADC functions itself. Of course, there are a variety of other ways that the mobile terminal 100 might track ambient temperature.

Figure 8:
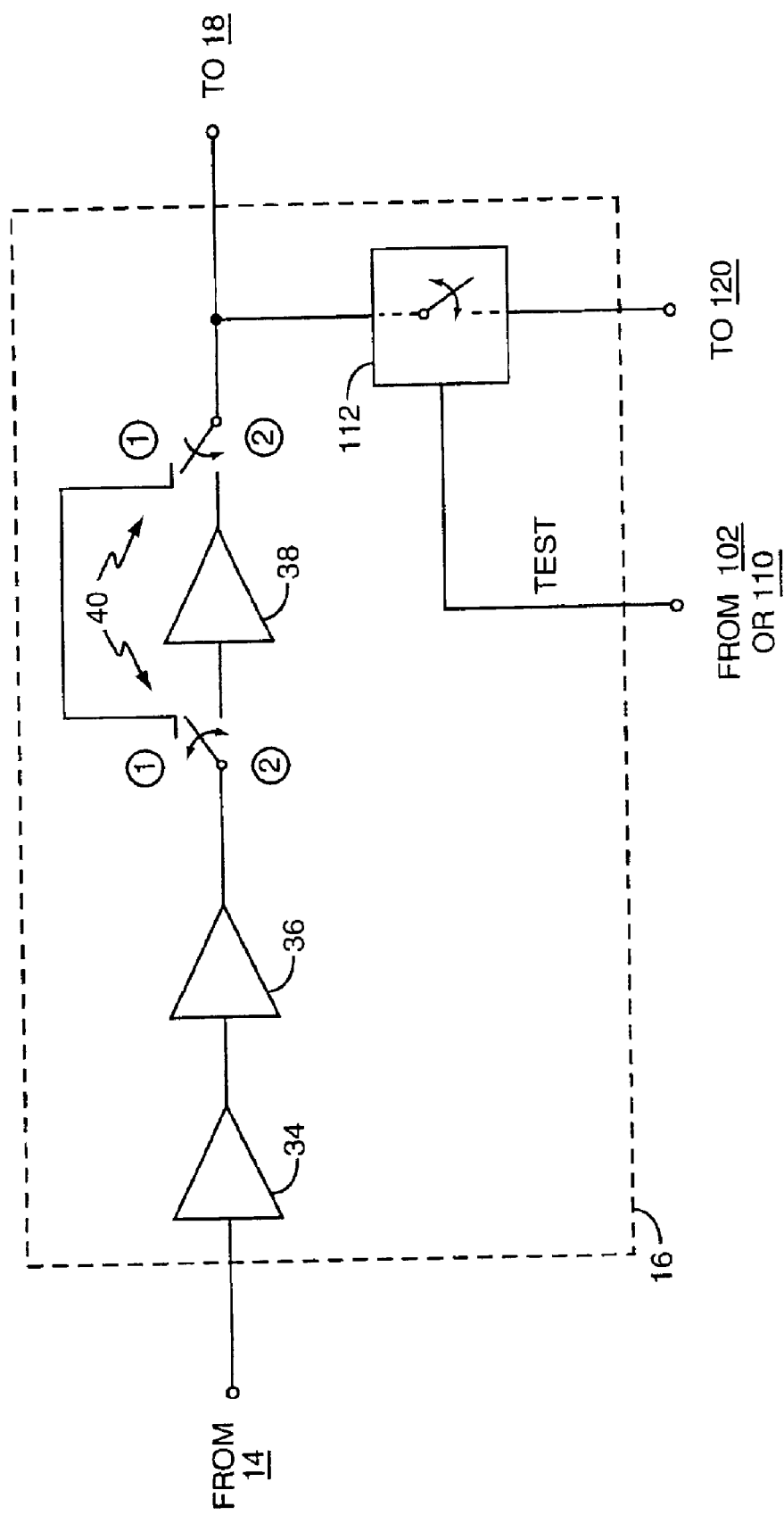
FIG. 8 is a diagram of the transmitter of FIG. 7 with additional test circuits.

The characteristic phase shift of the transmit amplifier 16, or at least the characteristic change in phase shift associated with enabling the second amplifier stage 38, may be determined in a number of ways. For example, the phase shift value or values might simply be calculated a design time and stored in the mobile terminal 100 as part of the manufacturing process. FIG. 8 illustrates an alternative approach, where the mobile terminal 100 determines the phase shift values based on self-testing. With this approach, the mobile terminal 100 can "calibrate" itself, and also revise stored phase shift values during operation to account for changes, such as in temperature or in aging.

FIG. 8 includes the elements of the transmit amplifier 16 as discussed above, but adds a test circuit 112 that permits feeding back the transmit signal output to the receiver 120. In this manner, the mobile terminal 100 could generate a test signal, for example, a simple tone, and then measure phase shift changes in the feedback signal associated with changing modes in the transmit amplifier 16. The test circuit 112 might be incorporated into the coupling circuit 20 of the antenna assembly 18, since that circuit likely already includes a receive/transmit switch. With in situ testability, the mobile terminal 100 can determine the compensation value or values used in compensation signal generation essentially whenever required.

The present invention may, of course, be carried out in other specific ways than those herein set forth with departing from the scope and essential characteristics of the invention. Indeed, the present invention presents a generalized way to substantially prevent phase shift changes in a transmitted signal arising from changing transmitter configurations. These configuration changes may arise from the need to operate in different transmit signal power ranges, or from the need to make other types of changes in transmit signal generation. The present embodiments are therefore to be construed in all aspects as illustrative and not restrictive, and all changes coming within the meaning and equivalency of the appended claims are intended to be embraced herein.

What is claimed is:

1. A transmitter comprising:

a modulator to generate a modulated output signal responsive to at least one baseband information signal;

an amplifier to generate a transmit signal based on amplifying said modulated output signal, said amplifier having at least first and second operating modes; and a phase compensator to selectively impart a compensating phase shift to said at least one baseband information signal to offset an expected phase shift imparted to said transmit signal by said amplifier when operating in said second mode;

said phase compensator comprising a complex multiplier to selectively multiply said at least one baseband information signal by a compensation term to impart said compensating phase shift to said at least one baseband information signal that is opposite of said expected phase shift imparted to said transmit signal by said amplifier when operating in said second mode.

2. The transmitter of claim 1 wherein said amplifier comprises a multi-stage power amplifier with at least one selectively enabled amplifier stage, that is selectively enabled to switch between said first and second operating modes.

3. The transmitter of claim 1 wherein said phase compensator further comprises:
an indicator signal input to receive a mode indicator identifying a current mode of said amplifier, said current mode being one of said at least first and second modes;
a compensation signal input to receive compensation values;
processing logic, including said complex multiplier, to multiply said at least one baseband information signal by a compensation term based on said compensation values; and
control logic responsive to said mode indicator to select as output from said phase compensator said at least one baseband information signal taken before or after operation of said processing logic.

4. The transmitter of claim 3, further comprising a processor to generate said compensation values used to set said compensation term.

5. The transmitter of claim 4, further comprising memory associated with said processor to hold at least one stored value used to set said compensation term.

6. The transmitter of claim 5, further comprising a look-up table structure of stored values used to vary said compensation term based on a current operating condition of said transmitter.

7. The transmitter of claim 6, wherein said look-up table structure comprises a table of stored values associated with operating said transmit amplifier over a range of ambient temperatures.

8. The transmitter of claim 1 further comprising a test circuit to determine said expected phase shift imparted to said transmit signal by said amplifier when operating in said second mode.

9. The transmitter of claim 8, further comprising a processor to selectively activate said test circuit.

10. The transmitter of claim 9, further comprising memory associated with said test circuit to store a reference value determined from testing said amplifier via said test circuit, said reference value used to set said compensation term.

11. The transmitter of claim 1 further comprising memory to store a reference value representative of said expected phase shift imparted to said transmit signal by said amplifier when operating in said second mode, said reference value used by said phase compensator to set said compensation term.

12. The transmitter of claim 1 wherein said phase compensator comprises a portion of a digital processor executing program instructions to effect phase compensation of said at least one baseband information signal.

13. The transmitter of claim 1 wherein said transmitter comprises a base station transmitter forming a portion of a base station, said base station supporting wireless communication with at least one mobile terminal.

14. The transmitter of claim 1 wherein said transmitter comprises a mobile terminal transmitter forming a portion of a mobile terminal, said mobile terminal supporting wireless communication in a mobile communication environment.

15. The transmitter of claim 14 wherein said mobile terminal further comprises a processor to control said phase compensator.

16. A method of substantially preventing phase shift changes in a transmit signal arising from changing modes in a transmit amplifier, the method comprising:
generating a modulated signal responsive to a baseband information signal;
amplifying said modulated signal via said transmit amplifier to generate said transmit signal;
selectively operating said transmit amplifier in a first mode and at least one additional mode, wherein each additional mode imparts an expected phase shift in said transmit signal relative to said first mode;
sensing when said amplifier changes to one of said additional modes; and
imparting a compensating phase shift to said baseband information signal that is opposite to said expected phase shift imparted to said transmit signal for a current one of said at least one additional modes.

17. The method of claim 16 wherein said first mode and said at least one additional mode of operating said transmit amplifier correspond to different transmit power ranges, and further comprising setting a value of said compensating phase shift based on a current one of said at least one additional modes.

18. The method of claim 16 further comprising updating a value of said compensating phase shift based on at least one current operating condition of said transmit amplifier.

19. The method of claim 18 wherein said at least one current operating condition of said transmit amplifier comprises ambient temperature, and further comprising setting said compensating phase value based on a current ambient temperature of said transmit amplifier.

20. The method of claim 18 further comprising accessing a look-up table based on said current ambient temperature to set said value of said phase shift imparted to said baseband information signal.

21. The method of claim 16 further comprising:
testing said transmit amplifier to determine a calibrated value for said characteristic change in phase shift imparted to said transmit signal for at least one of said at least one additional modes; and
storing said calibrated value for subsequent use in imparting said phase shift to said baseband information signal.

22. The method of claim 21 further comprising updating said calibrated value based on periodic testing of said transmit amplifier.

23. The method of 16 wherein said transmit amplifier comprises a portion of a mobile terminal for use in a mobile communication network, and further comprising:
changing between said first mode and said additional modes based on a transmit signal requirement of said mobile terminal; and
setting a value of said compensating phase shift based on a current one of said first mode and said additional modes.

24. The method of claim 23 wherein said transmit signal requirement is a transmit signal power requirement, and further comprising selecting one of said first mode and said additional modes of said transmit amplifier based on said transmit signal power requirement.

25. The method of claim 16 wherein imparting said compensating phase shift to said baseband information signal that is opposite to said expected phase shift imparted to said transmit signal for a current one of said at least one additional modes comprises:
imparting no compensating phase shift to said baseband information signal when said transmit amplifier operates in said first mode; and
imparting a selected compensating phase shift to said baseband information signal when said transmit amplifier operates in one of said additional modes.

* * * * *